United States Patent [19]

Morcom et al.

[11] 4,333,100

[45] Jun. 1, 1982

[54] ALUMINUM SCHOTTKY CONTACTS AND SILICON-ALUMINUM INTERCONNECTS FOR INTEGRATED CIRCUITS

[75] Inventors: William R. Morcom, Melbourne Beach; Hugh C. Nicolay, Melbourne Village; Jeffrey D. Peters, Palm Bay, all of Fla.

[73] Assignee: Harris Corporation, Melbourne, Fla.

[21] Appl. No.: 911,558

[22] Filed: May 31, 1978

[51] Int. Cl.³ .................... H01L 23/48; H01L 29/46; H01L 29/54

[52] U.S. Cl. ........................................ 357/71; 357/15; 357/67; 357/65

[58] Field of Search ................ 357/15, 71, 67, 65

[56] References Cited

U.S. PATENT DOCUMENTS

| | | | |
|---|---|---|---|
| 3,241,931 | 3/1966 | Triggs et al. | 357/67 |
| 3,293,087 | 12/1966 | Porter | 357/48 |
| 3,397,450 | 8/1968 | Bittmann et al. | 357/15 |
| 3,463,975 | 8/1969 | Biard | 357/15 |
| 3,474,304 | 10/1969 | Currin et al. | 357/65 |
| 3,609,470 | 9/1971 | Kuiper | 357/71 |
| 3,830,657 | 8/1974 | Farrar | 357/71 |
| 3,855,612 | 12/1974 | Rosvold | 357/15 |
| 3,878,552 | 4/1975 | Rodgers | 357/15 |
| 3,909,837 | 9/1975 | Kronlage | 357/15 |
| 3,924,264 | 12/1975 | Dorler et al. | 357/67 |
| 3,946,426 | 3/1976 | Sanders | 357/68 |
| 3,962,590 | 6/1976 | Kane et al. | 357/15 |
| 4,015,283 | 3/1977 | Hayashi et al. | 357/15 |
| 4,042,953 | 8/1977 | Hall | 357/59 |

Primary Examiner—Andrew J. James
Attorney, Agent, or Firm—Leitner, Palan, Martin & Bernstein

[57] ABSTRACT

A silicon substrate integrated circuit having a layer of aluminum forming Schottky contacts with lightly doped N conductivity regions and silicon doped aluminum forming ohmic contacts to heavily doped N conductivity regions and forming interconnects between contacts.

9 Claims, 4 Drawing Figures

ALUMINUM SCHOTTKY CONTACTS AND SILICON-ALUMINUM INTERCONNECTS FOR INTEGRATED CIRCUITS

BACKGROUND OF THE INVENTION

1. Field of the Invention

The present invention relates generally to interconnects for integrated circuits and more particularly to the fabrication of Schottky and ohmic contacts to a silicon substrate using aluminum and silicon doped aluminum.

2. Prior Art

A major product of the semiconductor industry is integrated circuits formed of planar semiconductor devices in a substrate of silicon. Generally, a silicon oxide or glass coating overlies the silicon substrate, except in the actual contact areas. This coating functions to pacify the junctions and provide an insulation between the devices and the interconnects. Accordingly, the contact metal material must exhibit good adherence to the silicon and to the silicon oxide or glass, while not producing any undesirable reaction with—nor penetration of—the silicon or the oxide.

A metal interconnect system for integrated circuits must make a low resistance, non-rectifying contact to all types of silicon and must not react substantially with the silicon at moderate temperatures (500° C.). Aluminum has been found most suitable for use as interconnect with silicon planar devices in integrated circuits. Aluminum is an excellent conductor and adheres well to silicon and silicon oxide. It is also easily applied to semiconductor devices by evaporation and photoresist techniques and contacts made of aluminum are readily bondable with gold or aluminum wires.

Though aluminum has many excellent qualities and is widely used in the industry, it also has a variety of disadvantages. Specifically, aluminum and silicon greatly interdiffuse at 500° C. and since aluminum is a P type dopant, it can form a PN rectifying junction with the N type silicon. Thus, aluminum does not make a good ohmic contact with lightly doped N type silicon.

In a high frequency double-diffused NPN transistor, the emitter region is typically diffused into the base region to a very shallow depth of only about 1,500 to 2,000 angstroms. Due to the small geometry of the shallow double-diffused transistor, the edge of the emitter diffusion opening in the oxide mask layer is so close to the emitter-base junction at the surface of the wafer that horizontal migration of the interaction between the aluminum and the silicon formed during the alloying process of the aluminum at approximately 500° C. often shorts out the base-emitter junction as well as vertical migration, which may also short out the emitter-base junction.

One of the prior art's solutions is to use different contact metals for different contact regions. In U.S. Pat. No. 3,946,426, for example, contacts include molybdenum engaging all contact areas of N conductivity type regions and aluminum engaging said molybdenum and all contact areas of P conductivity type regions. Another prior art solution to the aluminum pitting or alloying with the silicon surface is to use a silicon doped aluminum contact metal. This is described in U.S. Pat. No. 3,382,568. Both of these solutions prevent the formation of Schottky contacts with N type regions. Although it is well known to use aluminum to form a Schottky contact with lightly doped N conductivity type silicon regions, as illustrated in U.S. Pat. Nos. 3,909,837 and 4,005,469, the pitting and alloying problem of aluminum with these regions is not addressed. Thus there exists a need for a metal interconnect system which is capable of forming Schottky and ohmic contacts with shallow N conductivity type silicon regions.

SUMMARY OF THE INVENTION

The present invention solves the problem of the prior art by using aluminum as the contact metal to form Schottky contacts with lightly doped N conductivity type silicon regions and using silicon doped aluminum to form ohmic contacts to heavily doped, N conductivity type, shallow silicon regions and use aluminum doped with silicon for interconnects. The metal contact to P conductivity type regions may be aluminum or silicon doped aluminum. The metal interconnects are formed of silicon doped aluminum selectively connecting the metal contacts.

To form a transistor having a base-collector Schottky diode clamp, the base is formed laterally encompassing a lightly doped, N conductivity type, surface collector region. An aluminum metal contact is made through an aperture greater than the surface area of the encompassed collector region thereby forming ohmic contact to the P-type base region and Schottky contact to the collector region. The base region forms a guard ring about the Schottky contact.

OBJECTS OF THE INVENTION

Accordingly it is a principle object of the present invention to provide an improved metal interconnect system for shallow planar doped silicon substrate regions using aluminum and aluminum alloys as contacts and interconnects.

Another object of the present invention is to provide contacts and interconnects using aluminum for Schottky contacts and silicon doped aluminum for ohmic contacts.

Still another object of the present invention is to take advantage of the adherent property of aluminum to silicon and the Schottky barrier relationship while minimizing the aluminum silicon alloying or pitting by the use of aluminum and silicon doped aluminum metal contact and interconnect system.

An even further object of the present invention is to form a Schottky contact clamping the base and collector, a base ohmic contact and a guard ring for the Schottky contact from a single layer of aluminum.

Other objects, advantages, and novel features of the invention will become apparent from the following detailed description of the invention when considered in conjunction with the accompanying drawings.

DESCRIPTION OF THE PREFERRED EMBODIMENTS

Figure 1:
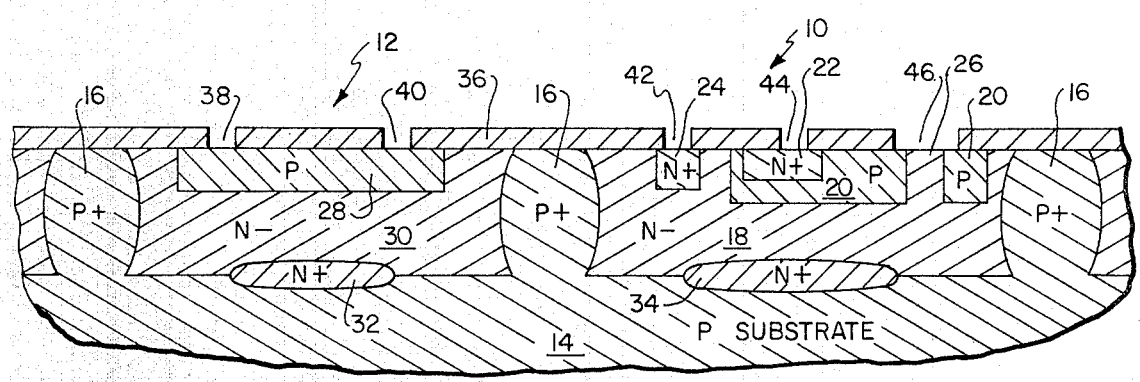
FIGS. 1–3 are cross-sectional views of an integrated circuit structure in progressive stages of development in the fabrication incorporating the principles of the present invention.

FIG. 1 depicts an integrated circuit including a bipolar transistor 10 and a resistor 12 formed in a substrate 14 including lateral barrier regions 16. The substrate is P conductivity type silicon and the barrier region 16 is heavily doped P+ conductivity type. Transistor 10 includes a lightly doped N− conductivity type region 18 as a collector, a P conductivity type base region 20 formed therein and an N+ emitter region 22 formed in the base region 20. The base region 20 is formed to encompass a region 26 of the collector 18 and provide a surface contact region. The base region 20 in effect provides a guard ring for collector surface region 26. A heavily doped N+ type contact region 24 is formed in the collector region 18. The resistor 12 includes a P type region 28 formed in a lightly doped N− type region 30. Heavily doped buried N+ regions 32 and 34 are formed at the junction of the N− regions 30 and 18, respectively, and the substrate 14.

The N− type regions 18 and 30 may have an impurity concentration of $1 \times 10^{16}$ carriers per cubic centimeter, P type regions 20 and 28 having an impurity concentration of $5 \times 10^{18}$ carriers per cubic centimeter and N+ type regions 22 and 24 have an impurity concentration of $1 \times 10^{20}$ carriers per cubic centimeter. These are mere examples of impurity concentration. Since it is desired to make Schottky contacts to the N− type regions, and ohmic contacts to the N+ type regions using aluminum and an silicon doped aluminum, respectively, the impurity concentration of the N− type regions must be less than $5 \times 10^{17}$ carriers per cubic centimeter and the impurity concentration of the N+ type regions must be greater than $1 \times 10^{19}$ carriers per cubic centimeter. The N+ type regions 22 and 24 are generally formed by diffusion to a depth of less than 1 micron and may be, for example, 0.3 microns with the P type regions having a depth of 0.6 microns, for example. Although transistor 10 is illustrated as an NPN and the resistor 12 is P type, it should be noted that PNP transistors and N type resistors as well as other semiconductor devices may be formed in the integrated circuit of substrate 14. Transistor 10 and the resistor 12 are illustrative of the types of devices and the connections to be made thereto using the aluminum and the silicon doped aluminum contact and interconnects of the present invention. The wafer is covered by a dielectric layer of insulating material 36 which is preferrably a silicon oxide.

Upon completion of the fabrication of planar semiconductor devices, a conventional photoresist and oxide etch process is used to form contact apertures in the silicon oxide layer 36. For the devices of FIG. 1, resistor contact apertures 38 and 40, collector contact aperture 42, emitter contact aperture 44 and base-collector contact aperture 46 are formed. The area of contact aperture 46 is formed to be greater than the surface area of collector surface region 26 so that the contiguous base regions form base and guard ring regions for the subsequently formed Schottky diode. As is well known, a photoresist layer is deposited on the oxide mask, the photoresist is exposed to light in accordance with a desired pattern, the pattern is developed through unexposed portions of the photoresist and the exposed portions of the oxide layer are removed with a suitable etchant. The remaining photoresist is then removed by stripping to leave an oxide mask with windows for the subsequent metal deposition.

Figure 2:
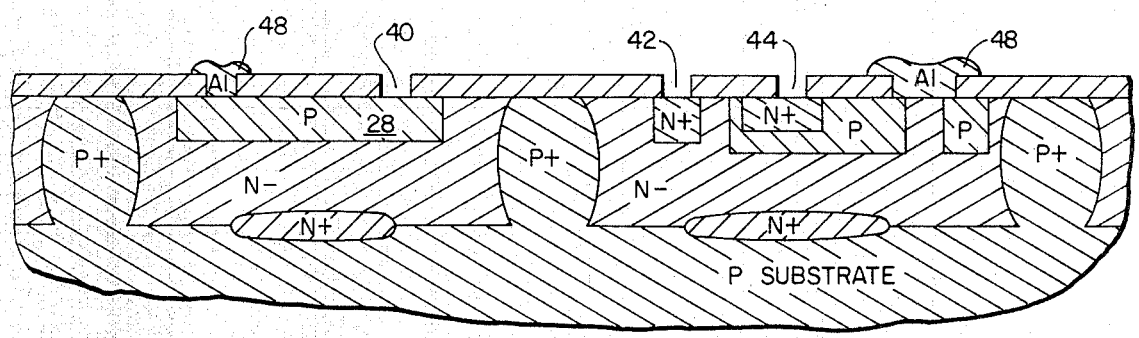

The wafer is then cleaned and placed in a vacuum evaporation apparatus. In this apparatus, aluminum is first melted and then vaporized by a heated filament. A thin film of aluminum metal of approximately 4,000–5,000 angstroms is deposited on the wafer as shown in FIG. 2 as layer 48. Though using vacuum evaporation techniques, the aluminum may be deposited by electron beam vacuum evaporation or sputtering.

The metalized wafer is again coated with a photoresist, exposed with a new mask to define the contact metal regions which are to be only aluminum. Specifically the contact regions to the N− type region wherein Schottky contacts or barriers are to be formed and defined. One of such regions is the contact aperture 46 between the base region 20 and the N− type, collector surface region 26. Also if desired, ohmic contacts to P type regions may be formed, one being illustrated in contact aperture 38 to the P type region 28 of resistor 12. It should be noted that contacts to all noncritical P type regions can be made by aluminum as illustrated or may be totally made by silicon doped aluminum to be formed hereafter. The exposed photoresist is developed and a suitable etchant is used to remove portions of aluminum layer 48 leaving contact regions in contact apertures 38 and 46. Aluminum layer 48 forms an ohmic contact with base region 20 and a Schottky contact with collector surface region 26. Since contact aperture 46 is larger than the surface area of collector region 26, the aluminum layer 48 also causes the contigous base region to form a guard ring about the Schottky contact.

The wafer is then cleaned and a layer of silicon doped aluminum of approximately 10,000 angstroms is deposited over the total wafer by low energy sputtering at, for example, 200 degrees centigrade to form layer 50. The silicon doped aluminum layer may also be formed by a co-deposition of silicon and aluminum or by applying a layer of aluminum and ion implanting silicon impurities therein. A photoresist process is performed to define the interconnect patterns between the devices and the integrated circuit producing the structures shown in FIG. 3. Silicon doped aluminum layer 50 makes contact with the resistor region 28 through aperture 40, contact with collector contact region 24 through aperture 42 and contact with emitter region 22 through aperture 44. Silicon doped aluminum layer 50 also makes contact with aluminum contact layer 48 in apertures 38 and 46 as well as defining the interconnects between the metal contact regions.

Figure 3:
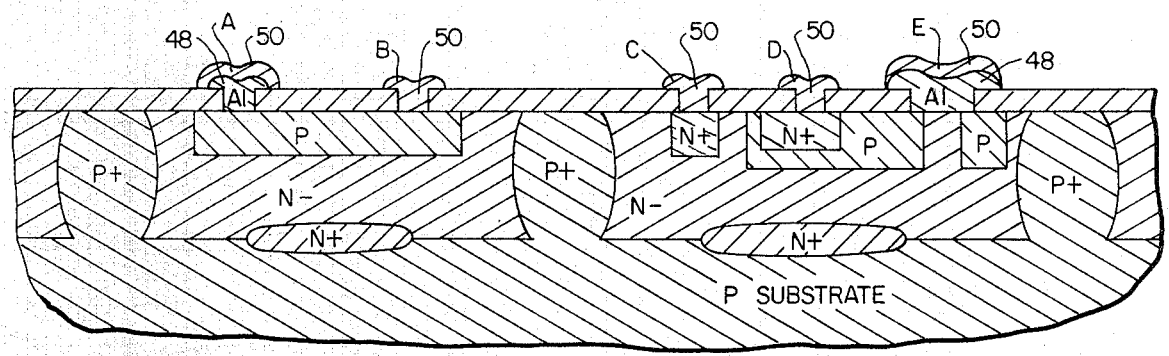
Figure 4:
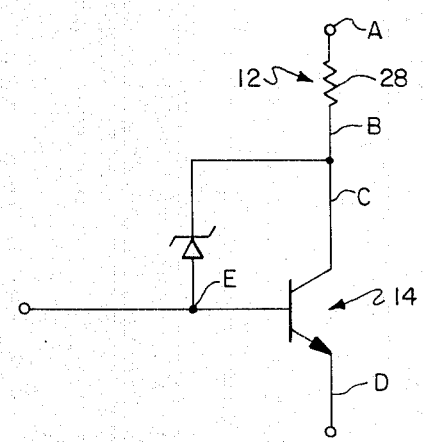
FIG. 4 is a schematic of the integrated circuit illustrated in FIG. 3.

Schematic illustrated in FIG. 4, the final integrated circuit of FIG. 3 includes a resistor contact A through aperture 38 and contact B through aperture 40. The collector contact C through aperture 42 is also connected to the resistor contact B by a silicon doped aluminum interconnect. An emitter contact D is formed through aperture 44. The contacts A, B, C and D form ohmic contacts with the surface of the substrate. Contact E which includes the aluminum layer 48 and the silicon doped aluminum layer 50 is formed in aperture 46 and extends across the base region 20 and the collector region 18. The aluminum forms an ohmic contact with the base region 20 and a Schottky contact or barrier region with the collector 18. Thus a base-collector Schottky diode clamp is formed.

As stated previously, the contact A to the resistor region 28 may include a single silicon doped aluminum layer 50 since aluminum does not detrimentally interact with P regions. Similarly, the contact region B to the P type region 28 may include double layer as does contact A. The criticality of the present invention is the use of silicon doped aluminum as ohmic contacts to shallow heavily doped N type surface regions and aluminum contacts to lightly doped N type regions to form Schottky contacts. The connection to P type regions may be made by aluminum or silicon doped aluminum and it is desired that the interconnects between the metal contact regions be formed by silicon doped aluminum.

Although a process for forming the present invention has been described in FIGS. 1-3 as including forming all the contact apertures during a single step, it is obvious that the process may be modified such that the contact apertures for the deposition of the first aluminum layer are first formed, and after the formation of the aluminum layer 48, the additional apertures for the silicon doped aluminum are subsequently formed. This alternate process for a dual metal system is described in the aforementioned U.S. Pat. No. 3,946,426.

From the preceding description of the preferred embodiments, it is evident that the objects of the invention are obtained and although the invention has been described and illustrated in detail, it is to be clearly understood that the same is by way of illustration and example only and is not to be taken by way of limitation. The spirit and scope of this invention is to be limited only by the terms of the appended claims.

What is claimed:

1. An integrated circuit comprising:
   a silicon wafer coated on one surface with a silicon oxide;
   heavily doped N conductivity type regions in said surface having a depth of less than one micron;
   lightly doped N conductivity type regions in said surface;
   P conductivity type regions in said surface;
   Schottky contacts to a portion of selected lightly doped N conductivity type regions through apertures in said oxide, each Schottky contact includes a layer of aluminum on said lightly doped N conductivity type regions;
   ohmic contacts to a portion of selected heavily doped N conductivity type regions through apertures in said oxide, each ohmic contact includes a layer of silicon doped aluminum on said heavily doped N conductivity type region; and
   interconnects selectively connecting said contacts, said interconnects includes a layer of silicon doped aluminum forming dual layer Schottky contact and single layer ohmic contacts.

2. The integrated circuit according to claim 1 including ohmic contacts to a portion of selected P conductivity type regions through apertures in said oxide, each ohmic contact includes a layer of silicon doped aluminum or aluminum and said interconnects selectively contact said ohmic contacts to said P conductivity type regions.

3. The integrated circuit according to claim 1 including a P conductivity type base region formed in a lightly doped N conductivity type collector region, a single layer of aluminum forming an ohmic contact to said base region and a Schottky contact to a surface region of said collector region through a single aperture in said oxide.

4. The integrated circuit according to claim 3 wherein said surface region of said collector region is encompassed by said base region and said single layer of aluminum contacts said surface region of said collector region and all contigous base regions.

5. The integrated circuit according to claim 1 wherein said silicon doped aluminum contact layers and said silicon doped aluminum interconnects are a single layer of silicon doped aluminum simultaneously applied to said silicon wafer and patterned to form said interconnects.

6. An integrated circuit formed in a silicon substrate comprising:
   an N conductivity type collector region in said substrate being lightly doped;
   a P conductivity type base region in the surface of said collector region;
   an N conductivity type emitter region in said base region having a depth of less than one micron;
   an ohmic base contact on a portion of said base region including a layer of silicon doped aluminum;
   an ohmic emitter contact including a layer of silicon doped aluminum on a portion of said emitter region; and
   a Schottky collector contact including a layer of aluminum on a portion of said collector region and a layer of silicon doped aluminum on said aluminum layer.

7. The integrated circuit according to claim 6 including a heavily doped N conductivity type region in said collector region and an ohmic collector contact including a layer of silicon doped aluminum on a portion of said heavily doped region.

8. The integrated circuit according to claim 6 wherein said base contact and said collector contact includes a common layer of aluminum on contigious portion of said base region and said collector region and a common layer of silicon doped aluminum on said layer of aluminum, said aluminum forming said ohmic base contact and a Schottky diode between said base region and said collector region.

9. The integrated circuit according to claim 8 wherein said common layer of aluminum extends over all the contiguous portions of base region encompassing the collector Schottky contact region to form a guard ring about the collector Schottky contact region.

* * * * *